(12) United States Patent
Heinrich et al.

(10) Patent No.: US 11,424,217 B2
(45) Date of Patent: Aug. 23, 2022

(54) SOLDERING A CONDUCTOR TO AN ALUMINUM LAYER

(71) Applicant: Infineon Technologies AG, Neubiberg (DE)

(72) Inventors: Alexander Heinrich, Bad Abbach (DE); Ralf Otremba, Kaufbeuren (DE); Stefan Schwab, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/943,084

(22) Filed: Jul. 30, 2020

(65) Prior Publication Data

US 2021/0035945 A1 Feb. 4, 2021

(30) Foreign Application Priority Data

Aug. 1, 2019 (DE) ...................... 10 2019 120 872.6

(51) Int. Cl.
*H01L 23/00* (2006.01)
*H01L 29/45* (2006.01)

(52) U.S. Cl.
CPC .............. *H01L 24/83* (2013.01); *H01L 24/05* (2013.01); *H01L 24/29* (2013.01); *H01L 24/32* (2013.01); *H01L 29/45* (2013.01); *H01L 2224/2912* (2013.01); *H01L 2224/29105* (2013.01); *H01L 2224/29109* (2013.01); *H01L 2224/29111* (2013.01); *H01L 2224/29113* (2013.01); *H01L 2224/29116* (2013.01); *H01L 2224/29139* (2013.01); *H01L 2224/29147* (2013.01); *H01L 2224/32245* (2013.01); *H01L 2224/32503* (2013.01); *H01L 2224/32507* (2013.01); *H01L 2224/8302* (2013.01); *H01L 2224/83022* (2013.01); *H01L 2224/8346* (2013.01);

(Continued)

(58) Field of Classification Search
None
See application file for complete search history.

(56) References Cited

U.S. PATENT DOCUMENTS 5,055,356 A 10/1991 Minow et al.
5,563,422 A 10/1996 Nakamura et al.
(Continued)

FOREIGN PATENT DOCUMENTS

DE 4316175 11/1994
DE 10 2016 210 910 12/2017
(Continued)

*Primary Examiner* — Nishath Yasmeen
(74) *Attorney, Agent, or Firm* — Dicke, Billig & Czaja, PLLC

(57) ABSTRACT

An arrangement is disclosed. In one example, the arrangement of a conductor and an aluminum layer soldered together comprises a substrate and the aluminum layer disposed over the substrate. The aluminum forms a first bond metal. An intermetallic compound layer is disposed over the aluminum layer. A solder layer is disposed over the intermetallic compound layer, wherein the solder comprises a low melting majority component. The conductor is disposed over the solder layer, wherein the conductor has a soldering surface which comprises a second bond metal. The intermetallic compound comprises aluminum and the second bond metal and is predominantly free of the low melting majority component.

20 Claims, 5 Drawing Sheets

(52) U.S. Cl.
CPC ........ *H01L 2224/8381* (2013.01); *H01L 2224/83191* (2013.01); *H01L 2224/83418* (2013.01); *H01L 2224/83423* (2013.01); *H01L 2224/83439* (2013.01); *H01L 2224/83444* (2013.01); *H01L 2224/83447* (2013.01); *H01L 2224/83449* (2013.01); *H01L 2224/83455* (2013.01); *H01L 2224/83464* (2013.01); *H01L 2224/83469* (2013.01); *H01L 2224/83471* (2013.01); *H01L 2224/83472* (2013.01); *H01L 2224/83486* (2013.01); *H01L 2224/83493* (2013.01); *H01L 2224/83815* (2013.01); *H01L 2224/83825* (2013.01); *H01L 2924/01327* (2013.01)

(56) References Cited

U.S. PATENT DOCUMENTS

| | | | | |
|---|---|---|---|---|
| 2009/0162622 A1* | 6/2009 | Van Veen | ............... | B23K 35/24 228/256 |
| 2010/0189594 A1* | 7/2010 | Fujiyoshi | ............... | B23K 35/26 420/560 |
| 2014/0197527 A1* | 7/2014 | Mengel | ............ | H01L 23/49586 257/676 |
| 2016/0010179 A1* | 1/2016 | Ueshima | ................. | H01B 1/02 228/111.5 |
| 2019/0311975 A1* | 10/2019 | Choi | ....................... | H01L 24/33 |
| 2020/0126944 A1* | 4/2020 | Joshi | ....................... | H01L 24/32 |
| 2020/0126946 A1* | 4/2020 | Joshi | ....................... | H01L 24/32 |
| 2021/0296204 A1* | 9/2021 | Yumoto | ................... | H05K 1/02 |

FOREIGN PATENT DOCUMENTS

| | | | |
|---|---|---|---|
| DE | 10 2017 012 210 | 1/2019 | |
| EP | 0357219 | 3/1990 | |
| EP | 0622858 | 11/1994 | |
| WO | WO-2018163864 A1 * | 9/2018 | ............... H05K 1/02 |

* cited by examiner

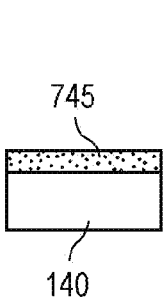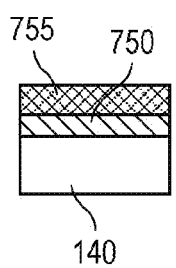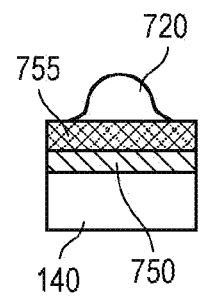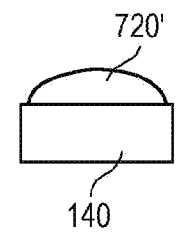
Fig. 7A  Fig. 7B  Fig. 7C  Fig. 7D
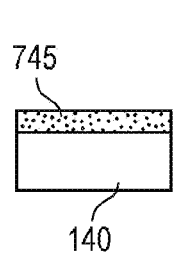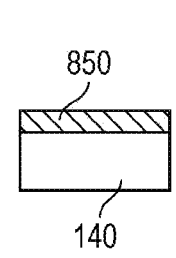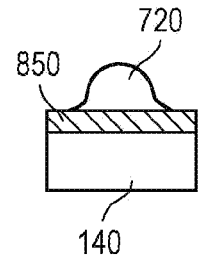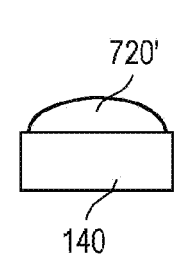
Fig. 8A  Fig. 8B  Fig. 8C  Fig. 8D

SOLDERING A CONDUCTOR TO AN ALUMINUM LAYER

CROSS-REFERENCE TO RELATED APPLICATION

This Utility patent application claims priority to German Patent Application No. 10 2019 120 872.6, filed Aug. 1, 2019, which is incorporated herein by reference.

TECHNICAL FIELD

This disclosure relates generally to the technique of soldering in semiconductor device manufacturing, and in particular to aspects of soldering a conductor to an aluminum layer.

BACKGROUND

Soldering processes are widely used in semiconductor device manufacturing for a variety of purposes, including chip bonding, wire/clip/ribbon bonding, device mounting etc. A variety of solder materials, fluxes, and soldering techniques is available. Soldering methods and soldering substances can have a high impact on cost, yield, performance and reliability of a semiconductor device.

While wire bonding on aluminum (Al) has become a widely established process, soldering on aluminum surfaces requires the application of highly reactive chemicals (fluxes) to remove the highly stable $Al_2O_3$ layer on Al. Such highly reactive chemicals are incompatible with standard semiconductor manufacturing processes. Therefore, soldering on Al surfaces today is limited to applications outside of semiconductor device manufacturing technology.

DE 10 2017 012 210 A1 relates to the soldering of a conductor to an aluminum layer and shows an arrangement which contains a substitute metal layer over an aluminum metallization and a solder layer over which the conductor is connected.

SUMMARY

According to an aspect of the disclosure, an arrangement of a conductor and an aluminum layer soldered together is described. The arrangement comprises a substrate. The aluminum layer is disposed over the substrate, wherein the aluminum of the aluminum layer forming a first bond metal. The arrangement further comprises an intermetallic compound layer disposed over the aluminum layer and a solder layer disposed over the intermetallic compound layer, wherein the solder of the solder layer comprises a low melting majority component. The conductor is dispose over the solder layer. The conductor has a soldering surface which comprises a second bond metal. The intermetallic compound of the intermetallic compound layer comprises aluminum, and the second bond metal and is predominantly free of the low melting majority component.

According to another aspect of the disclosure, a method of soldering a conductor to an aluminum layer on a substrate is described. At least a part of an aluminum oxide layer covering the aluminum layer is removed. A protective layer is applied over the aluminum layer to prevent regeneration of an aluminum oxide layer on the aluminum layer. Solder is placed between the protective layer and the conductor, wherein the solder comprises a low melting majority component and the conductor has a soldering surface which comprises a second bond metal. The conductor is soldered to the aluminum layer by heating the arrangement to a soldering temperature to melt the low melting majority component. The protective layer is at least partly dissolved in the molten solder. The second bond metal is transported from the soldering surface to the aluminum layer. An intermetallic compound layer is formed over the aluminum layer, wherein the intermetallic compound of the intermetallic compound layer comprises aluminum as a first bond metal and the second bond metal and is predominantly free of the low melting majority component.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be omitted if not described to be necessarily required. Embodiments are depicted in the drawings and are exemplarily detailed in the description which follows.

FIGS. 7A-7D are schematical cross-sectional illustrations of stages of a soldering process using an initial zincate treatment of the aluminum oxide layer.

FIGS. 8A-8D are schematical cross-sectional illustrations of stages of a soldering process using an initial halogenating treatment of the aluminum oxide layer.

DETAILED DESCRIPTION

Figure 1:
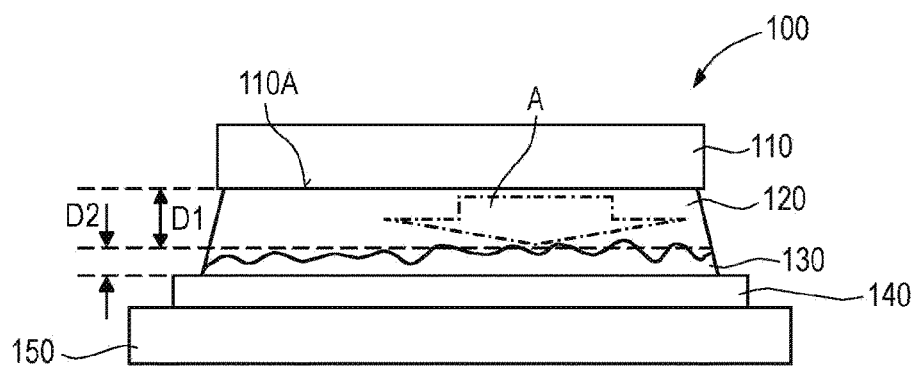
FIG. 1 is a cross-sectional view illustrating an example of an arrangement of a conductor and an aluminum layer on a substrate soldered together.

It is to be understood that the features of the various exemplary embodiments and examples described herein may be combined with each other, unless specifically noted otherwise.

In the following detailed description, reference is made to the accompanying drawings, which form a part thereof, and in which is shown by way of illustration specific embodiments. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present description. The following detailed description, therefore, is not to be taken in a limiting sense.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or disposed or located "over" a surface may be used herein to optionally mean that the part, element or material layer be located (e.g. placed, formed, disposed, arranged, deposited, etc.) "directly on", e.g. in direct contact with, the implied surface. The word "over" used with regard to a part, element or material layer formed or disposed or located "over" a surface may be used herein to mean that the part, element or material layer be located (e.g. placed, formed, disposed, arranged, deposited, etc.) "indirectly on" the implied surface with one or more additional parts, elements or layers being arranged between the implied surface and the part, element or material layer.

Further, an "alloy of X" (including further components Y, Z, . . . ) means that X is the majority component of the alloy, i.e. the contribution of X in % wt (percentage in weight) is greater than the contribution of Y in % wt and the contribution of Z in % wt, respectively. In particular, it may mean that the contribution of X is at least 50% wt. The same applies to solder compositions.

The notation XY refers to an alloy of X including at least Y as a further component. In particular, it may refer to an alloy of X including Y as a sole residual component (i.e. a closed composition). That is, in the second case, the notation XY means that the alloy XY has a composition consisting of X (of the percentage in weight of X) and Y (of the percentage in weight of Y), the balance being only inevitable elements. The notation XYZ . . . has an analogous meaning, i.e. an "open composition" or a "closed composition" with X, Y, Z, . . . forming the sole constituents of the alloy (except inevitable elements). The same applies to solder compositions.

Embodiments described herein may be used for soldering semiconductor substrates such as, e.g., semiconductor chips or semiconductor wafers, having electrically conducting electrodes comprising an aluminum layer (also referred to as an aluminum metallization layer) to a metal conductor.

As known in the art, an aluminum layer is coated with a highly stable $Al_2O_3$ layer. $Al_2O_3$ has a free enthalpy of formation of $\Delta Gf^0 = -1582.3$ kJ/mol. This highly stable oxide can only be removed by highly reactive chemicals, e.g. strong and aggressive flux systems. Such strong and aggressive flux systems, however, lead to structural damages and/or reliability issues due to flux residues which yield a significant corrosion risk due to chemical compounds such as, e.g., HCl and/or HF and/or $H_2SO_4$ involved. On the other hand, solder pastes containing fluxes which are conventionally used in semiconductor soldering such as low activated fluxes based on kolophonium or other organic acids (e.g. malonic acid or oxalic acid) are not able to remove the highly stable $Al_2O_3$ layer from the aluminum metallization.

Further, a bare aluminum surface only enables soldering in a narrow time frame because of the high forming rate of $Al_2O_3$ on bare aluminum under air.

The utilization of special soldering equipment with hydrogen or formic acid is also not an option since the reduction of $Al_2O_3$ requires a very low oxygen level and high temperatures due to the high thermodynamic stability of $Al_2O_3$.

Several methods of providing a solderable aluminum layer prior to or during soldering a conductor atop an aluminum layer will be described further below. FIG. 1 is a cross-sectional view illustrating an example of an arrangement 100 of a conductor 110 and an aluminum layer 140 on a substrate 150 soldered together.

The substrate 150 may, e.g., be a semiconductor substrate 150. The semiconductor substrate 150 may comprise or be of a semiconductor material such as, e.g., Si, SiC, SiGe, GaAs, GaN, AlGaN, InGaAs, InAlAs, etc. For instance, the semiconductor substrate 150 may be a wafer or a chip.

In particular, the semiconductor substrate 150 may include one or more integrated circuits (ICs). The ICs may be monolithically implemented in the semiconductor substrate 150. The ICs may be power ICs such as, e.g., power transistors, power diodes or a power system-on-chip (SoC) such as, e.g., a power amplifier etc. Although the disclosure herein is not limited to power applications, power devices which are based on the principles described herein may be of particular interest because solder bonds provide for high electrical and thermal conductivity between the parts soldered together.

The substrate 150 is covered by the aluminum layer 140. The aluminum layer 140 does not need to be of aluminum only but may be an aluminum alloy, i.e. may contain contributions of, e.g., Si and/or Cu and/or Mg and/or SiCu and/or other elements such as, e.g, Ti, Zn, etc. For instance, the aluminum layer may be an AlCuSi alloy containing, e.g., 0% wt≤Cu≤5% wt
and 0% wt≤Si≤1% wt. By way of example, the aluminum layer 150 may be a 98.5Al-1.0Si-0.5Cu (i.e. 98.5% wt of Al, 1.0% wt of Si, 0.5% wt of Cu) aluminum alloy. A layer of any such aluminum alloy, in particular AlCu, AlSiCu, AlTiCu, AlMg, AlSi, or AlMgSiZn will also be referred herein as an "aluminum layer".

The aluminum layer 140 may be smooth or may be roughened.

The aluminum layer 140 may be a front side metallization or a backside metallization of the semiconductor substrate 150 (e.g. a semiconductor chip). For instance, the aluminum layer 140 may form a load electrode (e.g. drain electrode or source electrode) of a semiconductor power chip represented by the substrate 150.

The aluminum layer 140 is soldered to the conductor 110 via a solder layer 120 and an intermetallic compound layer 130, which will be described in more detail further below. The (electrical) conductor 110 may, e.g., be a clip, a leadframe, or a heat sink. The electrical conductor 110 may be configured to provide high electrical current via the solder layer 120, the intermetallic compound layer 130 and the aluminum layer 140 to the substrate 150 and, e.g., to an IC implemented in the substrate 150.

The conductor 110 has a soldering surface 110A which comprises or is made of a second bond metal. The soldering surface 110A may directly contact the solder layer 120. The soldering surface 110A may be made of the same metal material as the conductor 110 (e.g. may be the bare surface of the conductor 110) or may be a surface of a specific solder joint layer plated on the conductor 110. In the latter case, the conductor 110 may then be made of a material different from the second bond metal of the solder joint layer providing the soldering surface 110A.

In various examples described herein, the second bond metal is Cu or an alloy based on Cu and may, e.g., also form the bulk material of the conductor 110. However, in other embodiments the second bond metal is Ni, Ag, Fe, Au, Pt, Pd, Mn, Zn, Si, Cr, V, Mg, or an alloy based on anyone of these metals (e.g. AuAg, NiP, MgSiZn) and may or may not form the bulk material of the conductor 110 (which may, e.g., still be of Cu, alloy42(Fe/Ni), Ni, Ag, Fe, FeC (steel) or even Al). However, the second bond metal is different from Ag as a majority component, which is not suitable for embodiments described herein.

The soldering surface 110A of the conductor 110 may be smooth or may be roughened.

As shown in FIG. 1, the electrical and mechanical connection between the conductor 110 and the aluminum layer 140 is formed by a system of at least two layers, namely an intermetallic compound (IMC) layer 130 disposed over the aluminum layer 140 and a solder layer 120 atop the IMC layer 130.

The IMC of the IMC layer 130 comprises or is formed of aluminum and the second bond metal. As will be described in further detail below, the second bond metal was transported during the soldering process through the solder of the solder layer 120 to the interface between the solder and the aluminum. At this interface, the aluminum (first bond metal) from the aluminum layer 140 and the second bond metal (from the soldering surface 110A of the conductor 110) undergo a chemical reaction to build a new chemical compound, namely the IMC.

In other words, the solder layer 120 has the function of transporting the second bond metal from the soldering surface 110A of the conductor 110 to the aluminum layer 140 where the IMC (and thereby the IMC layer 130) is formed. The transport (or diffusion) process of the second bond metal through the solder layer 120 is indicated in FIG. 1 by a dashed arrow A.

The solder of the solder layer 120 may, e.g., be based on Pb, Sn, Bi, Ga, or In. This means that the low melting majority component of the solder may be Pb, Sn, Bi, Ga, or In, respectively. It is to be noted that all these metals do not participate in the formation of the IMC at the interface between the aluminum layer 140 and the solder layer 120. Therefore, the IMC of the IMC layer 130 is predominantly (or with the exception of small residual contributions of, e.g., less than 5% wt, 1% wt, 0.5% wt, or 0.1% wt) or completely free of the low melting majority component of the solder of the solder layer 120. Solders based on Zn (as a majority component) are not applicable since intermetallic phases are formed between Al and Zn.

Therefore, by using appropriate combinations of the first bond metal material and the solder, it is possible to obtain an IMC layer 130 which is predominantly (or, e.g., even completely) free of not only the low melting majority component of the solder but is also (optionally) predominantly (or, e.g., even completely) free of any of the low melting components of the solder. By way of example, if a PbSnAg solder is used, the IMC of the IMC layer 130 is free of Pb and Sn and Ag, i.e. is completely or predominantly (or at least with the exception of small residual contributions of, e.g., less than 5% wt, 1% wt, 0.5% wt, or 0.1% wt) free of any of the low melting metal components of the solder (e.g. may be free of all components of the solder). Similarly, when a SnSb solder is used (e.g. 85Sn-15Sb, i.e. 85% wt of Sn, 15% wt of Sb), the IMC of the IMC layer 130 is completely or predominantly (e.g. within the exceptional residual limits stated above) free of Sn and Sb. Moreover, when a solder is used which comprises or is of SnSbAg, the IMC of the IMC layer 130 is completely or predominantly (e.g. within the exceptional residual limits stated above) free of Sn, Sb and Ag.

In the following solder alloys are listed which are suitable in view of this disclosure:

Solders based on Pb with one or more components of metals of the group consisting of Sn, In, Bi, Ga, Sb, Cd, Ag, Au, Pt. For example PbSn, PbSnAg, PbSnIn, PbSnBi, PbSnInBi, PbSnInAg, PbIn, PbSnAg, PbInSb, PbSb, or PbBi.

Solders based on Bi with one or more components of metals of the group consisting of Sn, In, Sb, Cd, Ag, Au, Pt, Pd. For example BiSn, BiSb, or BiIn.

Solders based on Sn with one or more components of metals of the group consisting of In, Bi, Ga, Sb, Cd, Ag, Au, Pt, Pd. For example SnAg (3-10% wt), SnAu, SnIn, SnInAg, SnSb, SnSbAg, or SnAu.

Solders based on In, for example InCd.

The initial solder material which is used (i.e. the solder material at the time before the solder joint is established) may be free of the second bond metal, meaning that all second bond metal provided for the IMC of the IMC layer 130 may come from the soldering surface 110A of the conductor 110. In other embodiments the initial solder material may contain a specific contribution of the second bond metal. In this case, however, the amount of second bond metal (e.g. Cu) in the solder layer 120 is not sufficient to form the IMC of the IMC layer 130. That is, the transport process of second bond metal through the solder layer 120 is necessary to build up the IMC layer 130.

In the arrangement 100 as shown in FIG. 1 even if the initial solder material did not include any second bond metal, residuals of the second bond metal may be found in the solder layer 120 due to the transport process (see arrow A) through this layer.

The solder layer 120 may have a thickness D1 ranging from 2 µm to 100 µm. As the boundary between the IMC layer 130 and the solder layer 120 may be uneven (as will be illustrated further below), the thickness D1 is to be understood as a mean thickness of the solder layer 120.

The solder layer 120 may be a soft solder layer. In this case the thickness D1 of the solder layer 120 may, e.g., be in a range between 50 µm and 100 µm, and/or in particular equal to or greater than or less than 60 µm, 70 µm, 80 µm or 90 µm.

In other embodiments the solder layer 120 may be a diffusion solder layer. In this case the thickness D1 of the solder layer 120 may, e.g., be in a range between 2 µm and 7 µm, and/or in particular equal to or greater than or less than 3 µm, 4 µm, 5 µm, or 6 µm. A diffusion solder layer 120 is characterized in that all solder of the diffusion solder layer 120 has undergone a chemical reaction to form an intermetallic phase. By way of example, if the solder of the diffusion solder layer 120 is based on Sn, one or more intermetallic phases of Sn and the second bond metal are comprised in or form the solder of the solder layer 120. For example, if the second bond metal is Cu, the solder of the solder bond layer 120 may be formed by 6Cu-5Sn and/or 3Cu-1Sn.

The IMC layer 130 may have a thickness D2 ranging from, e.g., 2 µm and 10 µm. As the boundary between the IMC layer 130 and both the aluminum layer 140 and the solder layer 120 may be uneven (as will be illustrated further below), the thickness D2 is to be understood as a mean thickness of the IMC layer 130.

Figure 2:
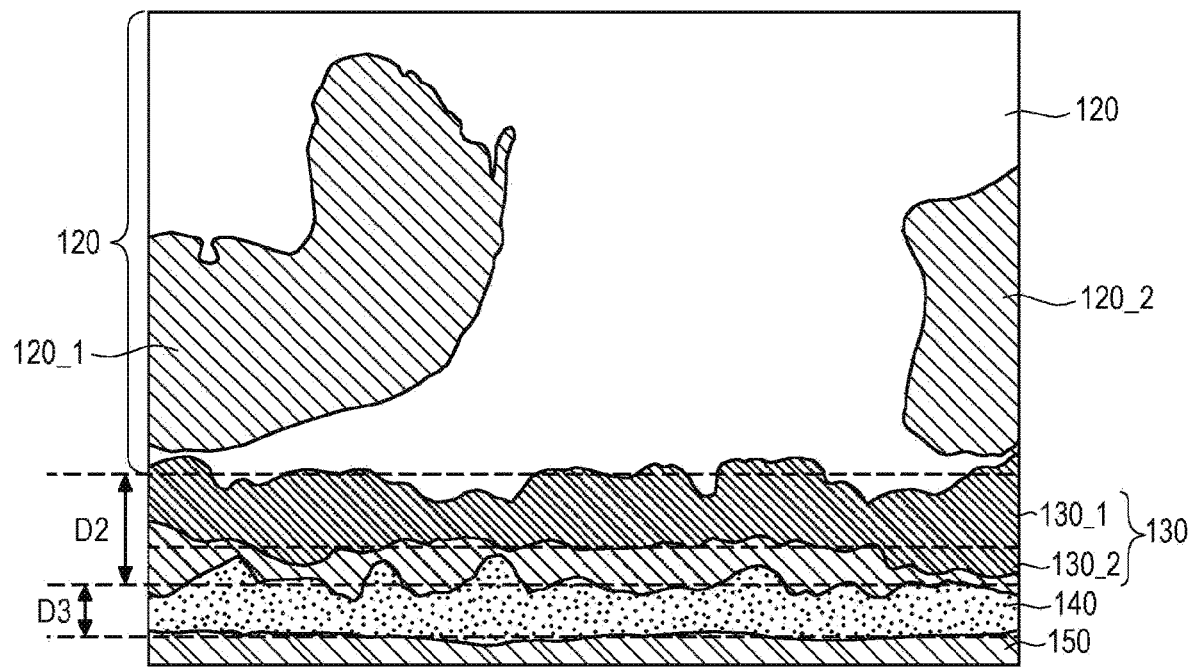
FIG. 2 is a cross-sectional scanning electron microscope (SEM) image depicting two intermetallic phases of an intermetallic compound layer of AlCu formed between an Al layer and a solder layer.

The IMC may comprise one or more different intermetallic phases of aluminum and the second bond metal. FIG. 2 is a cross-sectional scanning electron microscope (SEM) image depicting for instance two intermetallic phases of an IMC layer 130 of AlCu formed between the aluminum layer 140 and the solder layer 120. Here, the IMC layer 130 comprises a first intermetallic phase layer 130_1 and a second intermetallic phase layer 130_2.

The first intermetallic phase forming the first intermetallic phase layer 130_1 is an aluminum-rich phase and the second intermetallic phase forming the second intermetallic phase layer 130_2 is an aluminum-diluted phase. The aluminum-rich first intermetallic phase layer 130_1 may be located directly atop the aluminum layer 140 while the aluminum-diluted second intermetallic phase layer 130_2 may be located adjacent to the solder layer 120. Aluminum-rich may mean that aluminum may form the majority component in the aluminum-rich first intermetallic phase layer 130_1. Aluminum-diluted means that the content of aluminum in the second intermetallic phase is smaller than the content of aluminum in the first aluminum-rich intermetallic phase. The aluminum-diluted second intermetallic phase layer 130_2 may be a second bond metal-rich layer, i.e. the second bond metal may form the majority component in the aluminum-diluted second intermetallic phase layer 130_2.

For instance, the first intermetallic phase layer 130_1 may comprise or be of 2Al1Cu and/or the second intermetallic phase layer 130_2 may comprise or be of 4Al9Cu.

FIG. 2 further illustrates that the thickness D2 of the intermetallic compound layer 130 may be equal to or greater than a thickness D3 of the aluminum layer 140. For instance, the thickness D3 may range from, e.g., 1 μm to 5 μm, while D2 may be in the range mentioned above and/or may in particular be equal to or greater than or less than 3 μm, 5 μm, 7 μm, or 9 μm FIG. 2 further illustrates possible residues 120_1, 120_2 of Cu (or, more generally, of the second bond metal) which remained in the solder layer 120 during the solidification process.

Figure 3A:
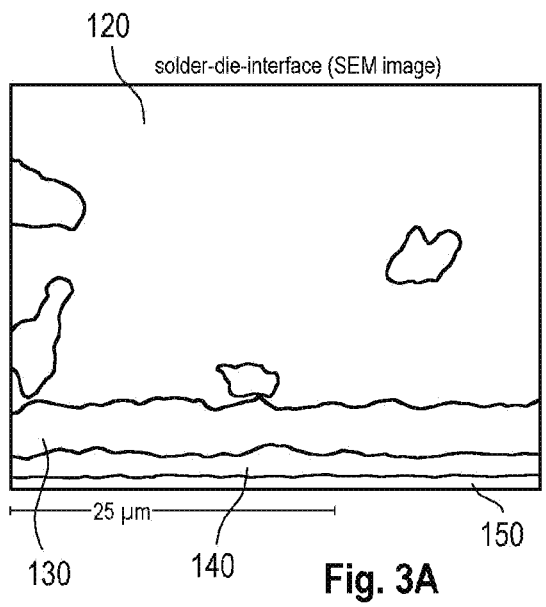
FIGS. 3A-3D are cross-sectional scanning electron microscope (SEM) images obtained without (FIG. 3A) and with image processing (FIGS. 3B-3D) to demonstrate an example arrangement of a zincated Al layer soldered with a Pb solder.
Figure 3B:
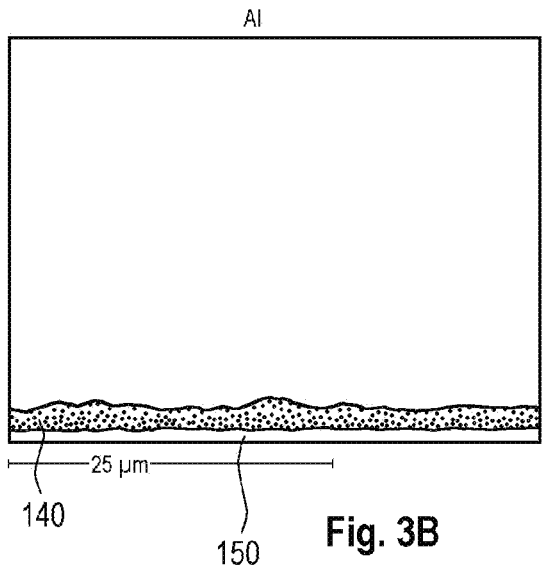
Figure 3C:
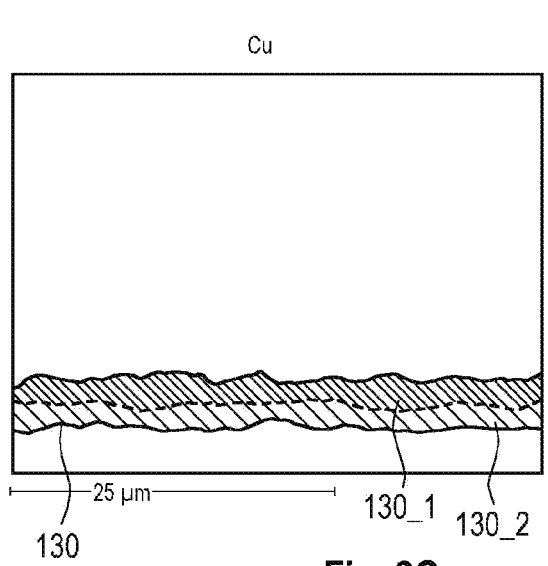
Figure 3D:
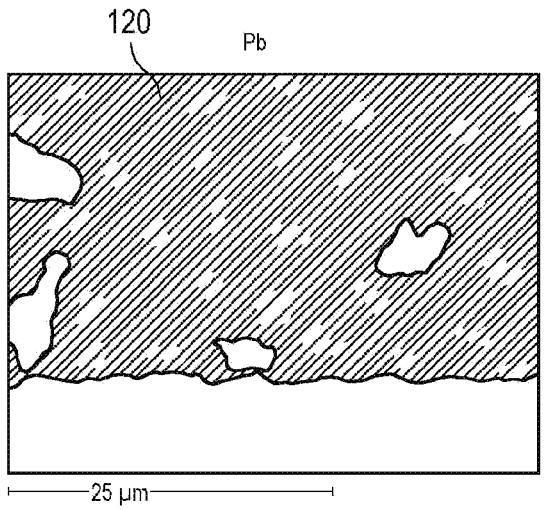

FIG. 3A is a cross-sectional SEM image showing a solder layer 120 formed over an intermetallic compound layer 130, an aluminum layer 140 and a substrate 150. In order to better distinguish between these layers, image-processed representations of FIG. 3A are shown in FIGS. 3B to 3D. More specifically, FIG. 3B separately illustrates the aluminum layer 140 of FIG. 3A, FIG. 3C separately illustrates the intermetallic compound layer 130 of FIG. 3A, and FIG. 3D separately illustrates the solder layer 120 of FIG. 3A. Again, it is apparent from a comparison of FIG. 3B and FIG. 3C that the intermetallic compound layer 130 may be thicker than the aluminum layer 140. The interface between the IMC layer 130 and the solder layer 120 may be wavy or uneven rather than flat. The two intermetallic phase layers 130_1 and 130_2 of the IMC layer 130 are visible in FIG. 3C and marked-up by different hatching styles and a separation line. Further, as apparent from FIG. 3D, the solder of the solder layer 120 may have a somewhat inhomogeneous structure, i.e. may include distributed contributions of second bond metal (e.g. Cu).

Figure 4A:
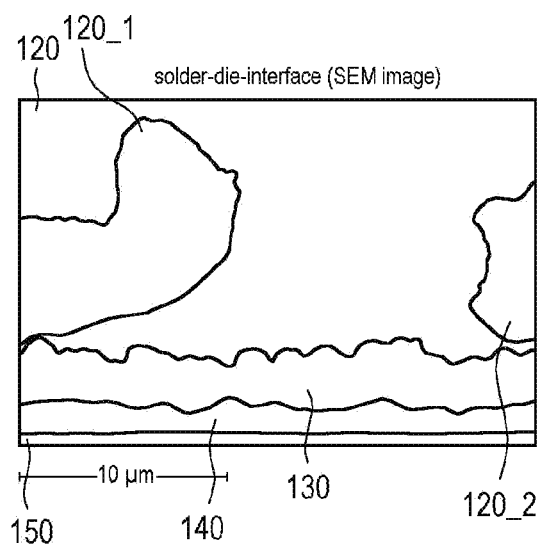
FIGS. 4A-4D are cross-sectional scanning electron microscope (SEM) images obtained without (FIG. 4A) and with image processing (FIGS. 4B-4D) to demonstrate an example arrangement of a zincated Al layer soldered with a Sn/Sb solder.
Figure 4B:
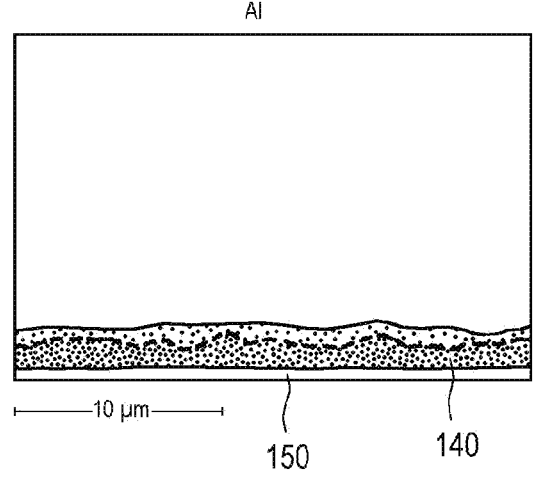
Figure 4C:
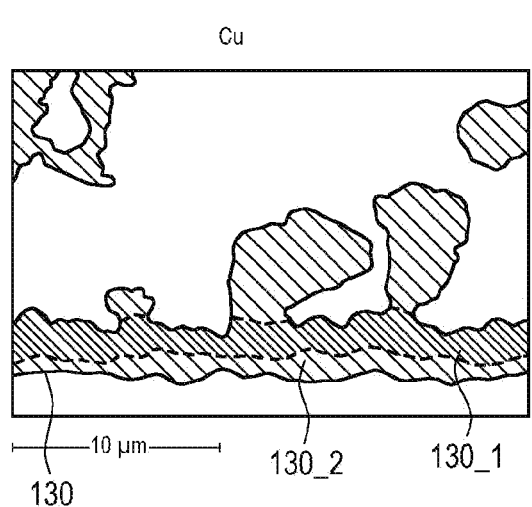
Figure 4D:
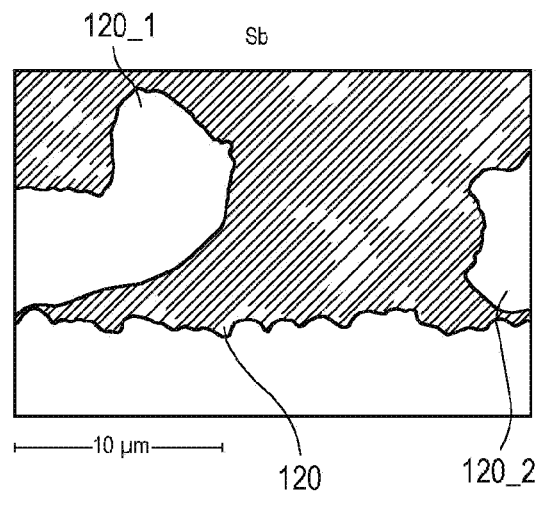

The SEM image of FIG. 4A is identical to the SEM image of FIG. 2. FIGS. 4B to 4D are obtained the same way as FIGS. 3B to 3D, respectively, i.e. by image processing of FIG. 4A. That is, FIG. 4B illustrates only the aluminum layer 140, FIG. 4C illustrates only the IMC layer 130 (again including the IMC phase layers 130_1 and 130_2) and FIG. 4D illustrates only the solder layer 120 (including the second bond metal residues 120_1, 120_2) of the arrangement.

In FIGS. 3A to 3D and 4A to 4D the aluminum layer 140 has a thickness D3 of, e.g., 3.2 μm. The initial aluminum oxide layer was removed by using a zincate treatment of the aluminum oxide layer before soldering. This process will be described in more detail further below. As to FIGS. 3A to 3D a 20 sec zincate process was applied before soldering, while in FIGS. 4A to 4D a 5 sec zincate treatment was used. In FIGS. 3A through 3D a Pb solder (more specifically a PbSnAg) was used, while FIGS. 4A through 4D had been obtained by using a Sn/Sb solder (more specifically a SnSbAg solder).

Figure 5:
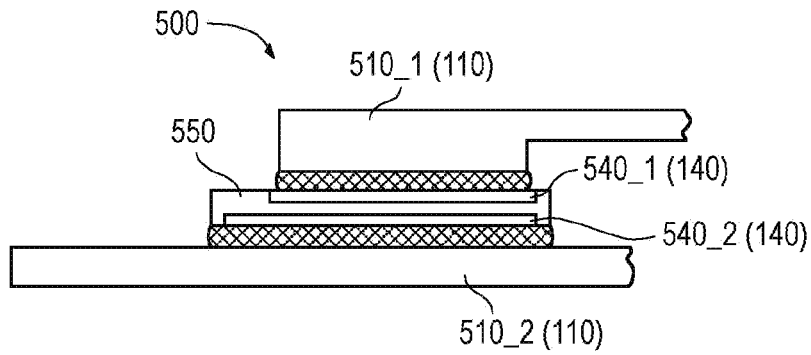
FIG. 5 is a cross-sectional view illustrating an exemplary arrangement of a conductor and an aluminum layer soldered together, wherein the conductor is a chip carrier or a clip and the aluminum layer is a chip electrode.

Generally, soldering as described herein can be carried out on an aluminum layer 140 which may, e.g., comprise an electrode of a wafer or of a chip forming the substrate 150. FIG. 5 illustrates an exemplary arrangement 500 of a semiconductor chip 550 (representing the substrate 150). In this example the aluminum layer 140 may be formed by a first electrode 540_1 at a top surface of the semiconductor chip 550 and/or may be formed by a second electrode 540_2 at a bottom surface of the semiconductor chip 550, or both. One of the electrodes 540_1, 540_2, in the exemplary arrangement 500 the first electrode 540_1, may be soldered to the conductor 110 which, in the arrangement 500 shown in FIG. 5, is represented by a clip 510_1. Alternatively or in combination the second electrode 540_2 may be soldered to a conductor 110 which, in the arrangement 500, is represented by a leadframe 510_2. Further, other types of conductors 110 may be soldered to electrodes 540_1 and/or 540_2 of the semiconductor chip 550, for instance a heat sink, a ribbon, etc.

The semiconductor chip 550 may, e.g., be a power chip such as, e.g., a power transistor. The first and/or second electrode 540_1, 540_2 may be a load electrode, e.g. a drain electrode and/or a source electrode of the semiconductor chip 550. The first and second electrodes 540_1, 540_2 may be soldered subsequently or simultaneously to the conductors 110, e.g. to the clip 510_1 and the leadframe 510_2.

Figure 6:
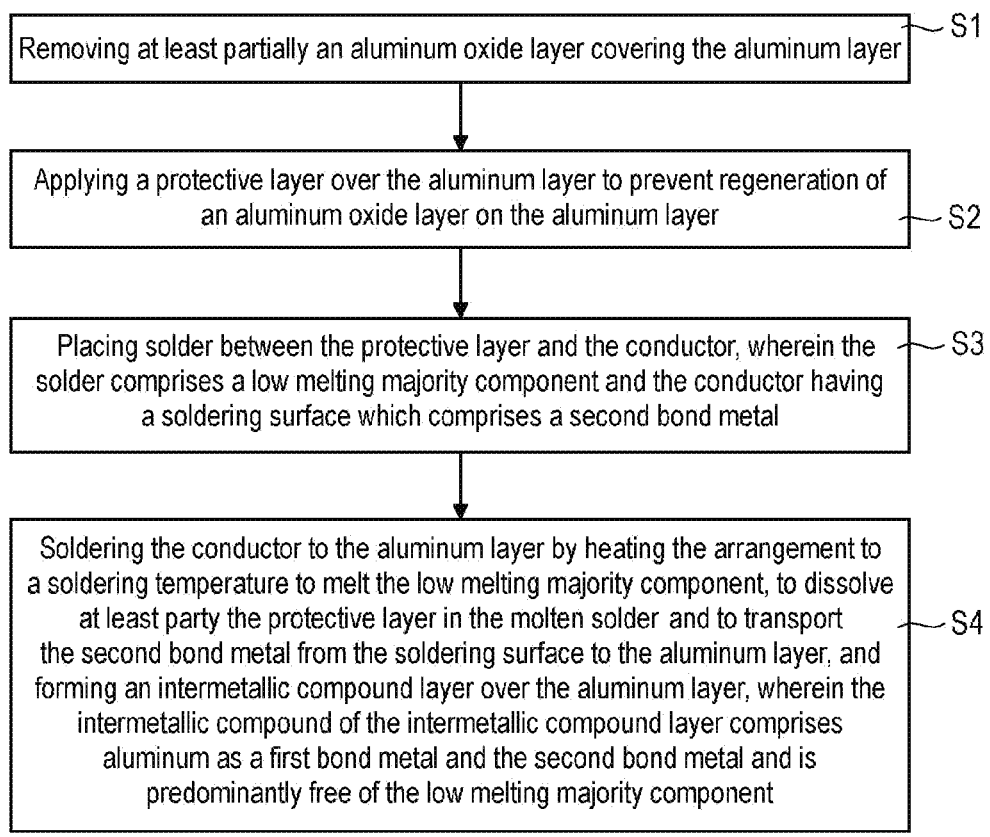
FIG. 6 is a flowchart schematically illustrating an exemplary method of soldering a conductor to an aluminum layer on a substrate.

Referring to the flowchart of FIG. 6, at S1 an aluminum oxide layer covering the aluminum layer is at least partly removed.

At S2 a protective layer is applied over the aluminum layer to prevent regeneration of an aluminum oxide layer on the aluminum layer. As will be described in more detail below, S1 and S2 may be performed by a zincate treatment of the aluminum oxide layer or by halogenating the aluminum oxide layer or by a combined zincate and halogenating treatment of the aluminum oxide layer.

At S3 solder is placed, e.g., on the protective layer so as be located between the protective layer and the conductor, wherein the solder comprises a low melting majority component and the conductor having a soldering surface which comprises a second bond metal.

The soldering process is performed at S4. The conductor is soldered to the aluminum layer by heating the arrangement to a soldering temperature to melt the low melting majority component of the solder and to dissolve, at least partly, the protective layer in the molten solder. The second bond metal is transported from the soldering surface of the conductor to the aluminum layer, thereby forming an IMC layer over the aluminum layer. The IMC of the intermetallic compound comprises or consists of aluminum as a first bond metal and the second bond metal and is (predominantly or completely) free of the low melting majority component of the solder.

As mentioned before, the IMC of the IMC layer may even be (predominantly or completely) free of any low melting components of the solder.

Referring to FIGS. 7A through 7D, stages of a soldering process using an initial zincate treatment of the aluminum oxide layer are exemplified. FIG. 7A illustrates an aluminum layer 140 covered by a thin aluminum oxide layer 745.

A thin Zn layer 750 is then deposited over the aluminum oxide layer 745. In an exchange process with the aluminum oxide layer 745, the aluminum oxide is then substituted by a Zn layer 750 and a ZnO layer 755. The substitution of the aluminum oxide layer 745 is caused by the enthalpy of formation of $\Delta Gf^0 = -320.5$ kJ/mol of ZnO as compared to $\Delta Gf^0 = -1582.3$ kJ/mol of aluminum oxide ($Al_2O_3$). This compares to the enthalpy of formation of copper oxide (e.g. CuO, $Cu_2O$) which is $\Delta Gf^0 \leq -147.9$ kJ/mol The ZnO layer 755 and the Zn layer 750 form a protective layer over the aluminum layer 140 which protects the aluminum layer 140 against oxidation, i.e. which prevents regeneration of an aluminum oxide layer on the aluminum layer 140.

As shown in FIG. 7C, solder 720 is then deposited over the protective layer or, more specifically, over the ZnO layer 755. The solder 720 can be activated with standard flux, i.e. a flux which is used for the activation of copper oxide during the reflow soldering, thus enabling wetting of the aluminum layer 140 by the molten solder 720', see FIG. 7D. During heating of the solder 720 to a soldering temperature, the solder 720 (or at least the low melting majority component of the solder 720) is melted and the protective layer 750, 755 is at least partly dissolved in the molten solder 720'.

FIGS. 8A to 8D illustrate stages of a soldering process using an initial halogenating treatment of the aluminum oxide layer 745 to provide for the protective layer which prevents re-oxidation of the aluminum layer 140. More specifically, the substitution of the aluminum oxide layer 745 may comprise applying a halogenide via, e.g., a plasma process to the aluminum oxide layer 745. Halogenating the aluminum oxide layer 745 produces a halogenated aluminum oxide layer 850, see FIG. 8B. The halogenated aluminum oxide layer 850 forms a protective layer over the aluminum layer 140 to prevent regeneration of an aluminum oxide layer on the aluminum layer 140.

Then, as depicted in FIG. 8C, solder 720 is deposited on the halogenated aluminum oxide layer 850 and heat is applied to reflow the solder 720. Again, the solder can be activated with standard flux which is used for the activation of copper oxide during solder reflow, thus enabling wetting of the aluminum layer 140 by the molten solder 720' as shown in FIG. 8D. During heating of the solder 720 to a soldering temperature, the solder 720 (or at least the low melting majority component of the solder 720) is melted and the protective layer (e.g. the halogenated aluminum oxide layer 850) is at least partly dissolved in the molten solder 720'.

By way of example, halogenating the aluminum oxide layer 850 may comprise fluorinating the aluminum oxide layer 850 which leads to the formation of aluminum fluoride or aluminum hydrofluoride as a halogenated oxide layer 850.

To summarize the processes shown in FIGS. 7A to 7D and 8A to 8D, a protective layer covering an aluminum surface being at least partly free of aluminum oxide may comprise or consist of zincate (e.g. Zn/ZnO) and/or aluminum fluoride and/or aluminum hydrofluoride which can be activated by a conventional flux and is dissolved in the molten solder during solder reflow.

The following examples pertain to further aspects of the disclosure:

Example 1 is an arrangement of a conductor and an aluminum layer soldered together, the arrangement comprising a substrate; the aluminum layer disposed over the substrate, the aluminum of the aluminum layer forming a first bond metal; an intermetallic compound layer disposed over the aluminum layer; a solder layer disposed over the intermetallic compound layer, the solder of the solder layer comprising a low melting majority component; and the conductor disposed over the solder layer, the conductor having a soldering surface which comprises a second bond metal; wherein the intermetallic compound of the intermetallic compound layer comprises aluminum and the second bond metal and is predominantly free of the low melting majority component.

In Example 2, the subject matter of Example 1 can optionally include wherein the low melting majority component is Pb, Sn, Bi, Ga, or In.

In Example 3, the subject matter of Example 1 or 2 can optionally include wherein the second bond metal is Cu, Ni, Ag, Fe, Au, Pt, Pd, Mn, Zn, Si, Cr, V, Mg, NiP, or AuAg.

In Example 4, the subject matter of any of the preceding Examples can optionally include wherein the intermetallic compound is predominantly free of any low melting components of the solder.

In Example 5, the subject matter of any of the preceding Examples can optionally include wherein the intermetallic compound comprises at least two different intermetallic phases of aluminum and the second bond metal, wherein a first intermetallic phase is an aluminum-rich phase and a second intermetallic phase is an aluminum-diluted phase.

In Example 6, the subject matter of any of the preceding Examples can optionally include wherein the intermetallic compound layer has a thickness of equal to or greater than a thickness of the aluminum layer.

In Example 7, the subject matter of any of the preceding Examples can optionally include wherein the solder layer is a soft solder layer.

In Example 8, the subject matter of Examples 1 to 6 can optionally include wherein the solder layer is a diffusion solder layer.

In Example 9, the subject matter of Example 8 can optionally include wherein the diffusion solder comprises one or more intermetallic phases of Sn and the second bond metal.

In Example 10, the subject matter of any of the preceding Examples can optionally include wherein the solder comprises PbSnAg, SnPb, SnSbAg, PbIn, or SnAgCu.

In Example 11, the subject matter of any of the preceding Examples can optionally include wherein the substrate is a wafer or a chip.

In Example 12, the subject matter of Example 11 can optionally include wherein the aluminum layer forms at least one electrode of the wafer or the chip.

In Example 13, the subject matter of any of the preceding Examples can optionally include wherein the conductor is a clip, a leadframe or a heat sink.

Example 14 is a method of soldering a conductor to an aluminum layer on a substrate, the method comprising: removing at least partially an aluminum oxide layer covering the aluminum layer; applying a protective layer over the aluminum layer to prevent regeneration of an aluminum oxide layer on the aluminum layer; placing solder between the protective layer and the conductor, wherein the solder comprises a low melting majority component and the conductor having a soldering surface which comprises a second bond metal; and soldering the conductor to the aluminum layer by heating the arrangement to a soldering temperature to melt the low melting majority component, to dissolve at least partly the protective layer in the molten solder and to transport the second bond metal from the soldering surface to the aluminum layer, and forming an intermetallic compound layer over the aluminum layer, wherein the intermetallic compound of the intermetallic compound layer comprises aluminum as a first bond metal and the second bond metal and is predominantly free of the low melting majority component.

In Example 15, the subject matter of Example 14 can optionally include wherein removing the aluminum oxide layer and applying the protective layer comprises a zincate treatment of the aluminum oxide layer.

In Example 16, the subject matter of Examples 14 or 15 can optionally include wherein removing the aluminum oxide layer and applying the protective layer comprises halogenating the aluminum oxide layer.

In Example 17, the subject matter of any of Examples 14 to 16 can optionally include wherein the intermetallic compound is predominantly free of any low melting components of the solder.

In Example 18, the subject matter of any of Examples 14 to 17 can optionally include wherein forming the intermetallic compound comprises forming at least two different intermetallic phases of aluminum and the second bond metal, wherein a first intermetallic phase is an aluminum-rich phase and a second intermetallic phase is an aluminum-diluted phase.

In Example 19, the subject matter of any of Examples 14 to 18 can optionally include wherein soldering is carried out as a soft soldering process.

In Example 20, the subject matter of any of Examples 14 to 18 can optionally include wherein soldering is carried out as a diffusion soldering process.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An arrangement consisting of a conductor and an aluminum layer soldered together, the arrangement comprising:
   a substrate;
   the aluminum layer arranged above the substrate, wherein the aluminum of the aluminum layer forms a first bond material;
   an intermetallic composition layer arranged above the aluminum layer;
   a solder layer which is arranged above and directly contacting the intermetallic composition layer, wherein the solder of the solder layer comprises a low-melting majority component; and
   conductor which is arranged above the solder layer, wherein the conductor has a soldering surface comprising a second bond metal, wherein the intermetallic composition of the intermetallic composition layer comprises aluminum and the second bond metal and is predominantly free of the low-melting majority component, wherein the intermetallic component comprises at least two different intermetallic phases of aluminum and the second bond metal, wherein a layer of a first intermetallic phase is an aluminum-rich phase, which is directly at the top of the aluminum layer, and a layer of a second intermetallic phase is an aluminum diluted phase, which is adjacent to the solder layer.

2. The arrangement of claim 1, wherein the low melting majority component is Pb, Sn, Bi, Ga, or In.

3. The arrangement of claim 1, wherein the second bond metal is Cu, Ni, Ag, Fe, Au, Pt, Pd, Mn, Zn, Si, Cr, V, Mg, NiP, or AuAg.

4. The arrangement of claim 1, wherein the intermetallic compound is predominantly free of any low melting components of the solder.

5. The arrangement of claim 1, wherein the intermetallic compound layer has a thickness of equal to or greater than a thickness of the aluminum layer.

6. The arrangement of claim 1, wherein the solder layer is a soft solder layer.

7. The arrangement of claim 1, wherein the solder layer is a diffusion solder layer.

8. The arrangement of claim 7, wherein the diffusion solder layer comprises one or more intermetallic phases of Sn and the second bond metal.

9. The arrangement of claim 1, wherein the solder comprises PbSnAg, SnPb, SnSbAg, PbIn, or SnAgCu.

10. The arrangement of claim 1, wherein the substrate is a wafer or a chip.

11. The arrangement of claim 10, wherein the aluminum layer forms at least one electrode of the wafer or the chip.

12. The arrangement of claim 1, wherein the conductor is a clip, a leadframe or a heat sink.

13. An arrangement comprising:
    a semiconductor chip;
    an aluminum first electrode arranged on the semiconductor chip, wherein the aluminum of the aluminum first electrode forms a first bond material;
    an intermetallic composition layer arranged above the aluminum first electrode;
    a solder layer which is arranged above and directly contacting the intermetallic composition layer, wherein the solder of the solder layer comprises a low-melting majority component; and
    a conductor which is arranged above the solder layer, wherein the conductor has a soldering surface comprising a second bond metal, wherein the intermetallic composition of the intermetallic composition layer comprises aluminum and the second bond metal and is predominantly free of the low-melting majority component, wherein the intermetallic component comprises at least two different intermetallic phases of aluminum and the second bond metal, wherein a layer of a first intermetallic phase is an aluminum-rich phase, which is directly at the top of the aluminum first electrode, and a layer of a second intermetallic phase is an aluminum diluted phase, which is adjacent to the solder layer.

14. The arrangement of claim 13, wherein the low melting majority component is Pb, Sn, Bi, Ga, or In.

15. The arrangement of claim 13, wherein the second bond metal is Cu, Ni, Ag, Fe, Au, Pt, Pd, Mn, Zn, Si, Cr, V, Mg, NiP, or AuAg.

16. The arrangement of claim 13, wherein the intermetallic compound is predominantly free of any low melting components of the solder.

17. The arrangement of claim 13, wherein the intermetallic compound layer has a thickness of equal to or greater than a thickness of the aluminum layer.

18. The arrangement of claim 13, wherein the solder layer is a soft solder layer.

19. The arrangement of claim 13, wherein the solder layer is a diffusion solder layer.

20. The arrangement of claim 13, wherein the conductor is a clip, a leadframe or a heat sink.

\* \* \* \* \*